US005909015A

United States Patent [19]

Yamamoto et al.

[11] Patent Number: 5,909,015

[45] Date of Patent: Jun. 1, 1999

[54] SELF-COOLED LOUDSPEAKER

[76] Inventors: Shuji Yamamoto, 938 Salem End Rd., Framingham, Mass. 01702; Richard G. Plourde, 17D Hampshire Dr., Nashua, N.H. 03063-1930

[21] Appl. No.: 09/048,446

[22] Filed: Mar. 26, 1998

[51] Int. Cl.[6] ...... H05K 5/00

[52] U.S. Cl. ...... 181/156; 381/397

[58] Field of Search ...... 181/148, 199, 181/156; 381/397, 414

[56] References Cited

U.S. PATENT DOCUMENTS

| | | | |
|---|---|---|---|
| 4,210,778 | 7/1980 | Sakurai et al. | 181/156 |
| 4,757,547 | 7/1988 | Danley | 381/397 |
| 5,042,072 | 8/1991 | Button | 381/397 |
| 5,357,586 | 10/1994 | Nordschow et al. | 381/397 |
| 5,497,428 | 3/1996 | Rojas | 381/414 |

*Primary Examiner*—Khanh Dang
*Attorney, Agent, or Firm*—Kriegsman & Kriegsman

[57] ABSTRACT

A self-cooling loudspeaker comprises a speaker frame, a diaphragm connected to the speaker frame, a voice coil connected to the diaphragm and a permanent magnet assembly having a central opening. The permanent magnet assembly comprises a permanent magnet disposed between a top plate and a bottom plate. A pole piece is disposed co-axially within the central opening of the permanent magnet assembly to form an air gap between the pole piece and the permanent magnetic assembly into which the voice coil is disposed. In one embodiment of the present invention, the top plate is stamped to form a plurality of intake air paths in communication with the air gap and a plurality of outtake air paths in communication with the air gap, the plurality of intake air paths having a decreasing cross-sectional area towards the central opening of the permanent magnet assembly, and the plurality of outtake air paths having an increasing cross-sectional area towards the central opening of the permanent magnet assembly. In use, the diaphragm moves linearly to produce sound, the linear movement of the diaphragm creating a unidirectional flow of air through the plurality of intake and outtake air paths. In a second embodiment of the present invention, the bottom plate is also stamped to form additional intake air paths in communication with the air gap and additional outtake air paths in communication with the air gap.

9 Claims, 4 Drawing Sheets

SELF-COOLED LOUDSPEAKER

BACKGROUND OF THE INVENTION

The present invention relates generally to loudspeakers and, more particularly, to loudspeakers which can be self-cooled through the natural vibratory motion of the loudspeaker diaphragm during normal operation.

Loudspeakers, or speakers, are well known and are commonly used in a wide variety of applications, such as in home theater stereo systems.

Loudspeakers typically comprise a coil of wire, typically referred to as a voice coil, which is suspended between the pole pieces of a permanent magnet. In operation, an alternating current is passed through the voice coil which produces a changing magnetic field around the voice coil. The changing magnetic field around the voice coil interacts with the magnetic field produced by the permanent magnet to produce reciprocal forces on the voice coil. The voice coil is disposed within the speaker so that it can oscillate in accordance with the reciprocal forces. The voice coil is attached to a cone shaped diaphragm which vibrates in response to the forces applied to the voice coil. The vibration of the diaphragm produces sound waves in the air.

Voice coils are constructed of a conductive material. As a consequence, when an electrical signal is passed through the voice coil, the coil will conduct heat. Because the voice coil is typically suspended between the pole pieces of the permanent magnet, which is often a relatively small enclosed volume, it has been found that, in operation, dissipated power in the voice coil leads to significant temperature rise, particularly in high-powered loudspeakers.

Significant temperature rise in the voice coil creates numerous disadvantages.

As a first disadvantage, it has been found that significant temperature rise can increase the resistance of the voice coil. This, in turn, results in a substantial portion of the electrical input power of the loudspeaker to be converted into heat rather than into acoustical energy, thereby limiting the level of performance of the loudspeaker, which is undesirable. In particular, it has been found that increased resistance of the voice coil in the loudspeaker can lead to non-linear loudness compression effects at high sound levels.

As a second disadvantage, it has been found that significant temperature rise can melt bonding materials in the voice coil. This can result in permanent structural damage to the loudspeaker.

As a third disadvantage, it has been found that significant temperature rise can burn out the voice coil. This can result in permanent structural damage to the loudspeaker.

As a consequence, numerous attempts have been made in the art to prevent significant temperature rise in the voice coil.

It is well known in the art to utilize additional components to prevent significant temperature rise in the voice coil. For example, a metallic voice-coil bobbin is often used to conduct heat away from the region of the voice coil. As another example, the voice coil is often coated with a low viscosity fluid to transfer heat produced by the voice coil into the magnetic structure from which it can more easily radiate into the surroundings. As yet another example, heat radiating fins are often mounted on the permanent magnet to improve secondary cooling.

It is also well known in the art to use cooling fans to prevent significant temperature rise in the voice coil. For example, in U.S. Pat. No. 4,757,547 to T. J. Danley, there is disclosed an air cooled speaker in which an electrical blower is used to pass cooling air through a loudspeaker driver. The blower is connected in parallel to the leads between the amplifier and speaker such that the blower speed and cooling increases with increased power consumption and heat generation by the driver.

The use of additional components to prevent significant temperature rise in the voice coil introduces numerous drawbacks. In particular, the use of additional components significantly increases the complexity of the speaker and consequently increases the overall cost of the speaker.

Accordingly, it is well known in the art for loudspeakers to utilize venting techniques to prevent significant temperature rise in the voice coil. Specifically, it is well known in the art for loudspeakers to include ventilating paths, or openings, in the permanent magnetic or in the loudspeaker diaphragm through which cooler air is permitted to pass through the loudspeaker and thereby lower the temperature of the voice coil. Loudspeakers which utilize venting techniques have significant advantages. In particular, such a loudspeaker only requires a change in the shape of the magnetic component or diaphragm and therefore requires no additional components, thereby minimizing complexity and cost.

It is known in the art for loudspeakers to utilize the self-pumping action of the loudspeaker diaphragm during operation to create a flow of air through ventilating paths which, in turn, lower the temperature of the voice coil. For example, in U.S. Pat. No. 5,042,072 to D. J. Button, there is disclosed a self-cooled electrodynamic loudspeaker wherein the magnetic structure or pole piece has channels whereby cool air may be introduced and hot air may be exhausted to cool a voice coil by movement of the speaker diaphragm. This self-cooling results in greater power handling and output of the speaker.

In U.S. Pat. No. 5,357,586 to D. D. Nordschow et al, there is disclosed a flow-through air-cooled loudspeaker system. The loudspeaker and enclosure are provided with aerodynamically-shaped passages providing low-pressure regions for inducing flows of air into and about the driver motor of the loudspeaker in response to vibratory movement of the speaker cone. An aerodynamically-shaped body is disposed within the pole piece to define a venturi passage for exchange of air between an interior chamber defined by a coil former and the back of the speaker. Aerodynamically-shaped openings are provided through the pole piece for inducing flow of air about the voice coil in the voice coil gap between the pole piece and permanent magnet. The speaker frame support is provided with aerodynamically-shaped openings to induce air flow into the interior chamber. In this manner, low-pressure regions established by the aerodynamic shapes induce flow of cooling air about the voice coil and pole piece in response to vibratory movement of the cone. Aerodynamic shapes are disposed in the intake and exhaust vents of the speaker enclosure to exchange air between the enclosure and atmosphere in response to vibratory movement of the speaker.

Loudspeakers which utilize venting techniques typically experience at least one of the following drawbacks.

As a first drawback, it has been found that loudspeakers which utilize venting techniques are experience difficulty in drawing in cooler air and in passing out warmer air. Specifically, it has been found that the same warm air particles which are pushed away from the voice coil during one half of the self-pumping cycle of the loudspeaker are pulled back in towards the voice coil during the second half of the self-pumping cycle. After a period of use, a state of near equilibrium gets established and produces an oscillating column of air within the permanent magnet which has the same temperature as the voice coil, thereby preventing the air from significantly lowering the temperature of the voice coil.

As a second drawback, it has been found that loudspeakers which utilize venting techniques tend to draw stray particles into the proximity of the voice coil. In particular, it has been found that stray magnetized particles are often drawn to the voice coil. As such, it has been found that the stray magnetized particles can get trapped along the voice coil due to the high flux density magnetic field of the loudspeaker. This can cause stray magnetized particles to accumulate along the voice coil to the point that significant mechanical noise is introduced and to the point that movement of the diaphragm is interfered therewith.

SUMMARY OF THE INVENTION

It is an object of the present invention to provide a new and improved loudspeaker.

It is another object of the present invention to provide a loudspeaker which utilizes air flow to prevent significant temperature rise in the voice coil.

It is yet another object of the present invention to provide a loudspeaker of the type described above which produces air flow to prevent significant temperature rise in the voice coil through the natural vibratory motion of the loudspeaker diaphragm during normal operation.

It is still another object of the present invention to provide a loudspeaker of the type described above which is designed to prevent magnetized particles from moving in towards the voice coil of the loudspeaker.

It is another object of the present invention to provide a loudspeaker of the type described above which has a limited number of parts, which is inexpensive to manufacture and which is easy to use.

Accordingly, there is provided a self-cooling loudspeaker comprising a speaker frame, a diaphragm connected to said speaker frame, said diaphragm being capable of linear movement, a voice coil connected to said diaphragm, a permanent magnet assembly having a central opening, a pole piece disposed co-axially within the central opening of said permanent magnet assembly to form an air gap between said pole piece and said permanent magnetic assembly into which said voice coil is disposed, and at least one intake air path formed in said permanent magnet assembly in communication with the air gap, said at least one intake air path having a decreasing cross-sectional area towards the central opening of said permanent magnet assembly, wherein linear movement of said diaphragm produces a unidirectional flow of air through said at least one intake air path.

Various other features and advantages will appear from the description to follow. In the description, reference is made to the accompanying drawings which form a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

A fuller understanding of the nature and objects of the present invention will become apparent upon consideration of the following detailed description taken in connection with the accompanying drawings, wherein like reference numerals represent like parts.

DETAILED DESCRIPTION OF THE PREFERRED EMBODIMENT

Figure 1:
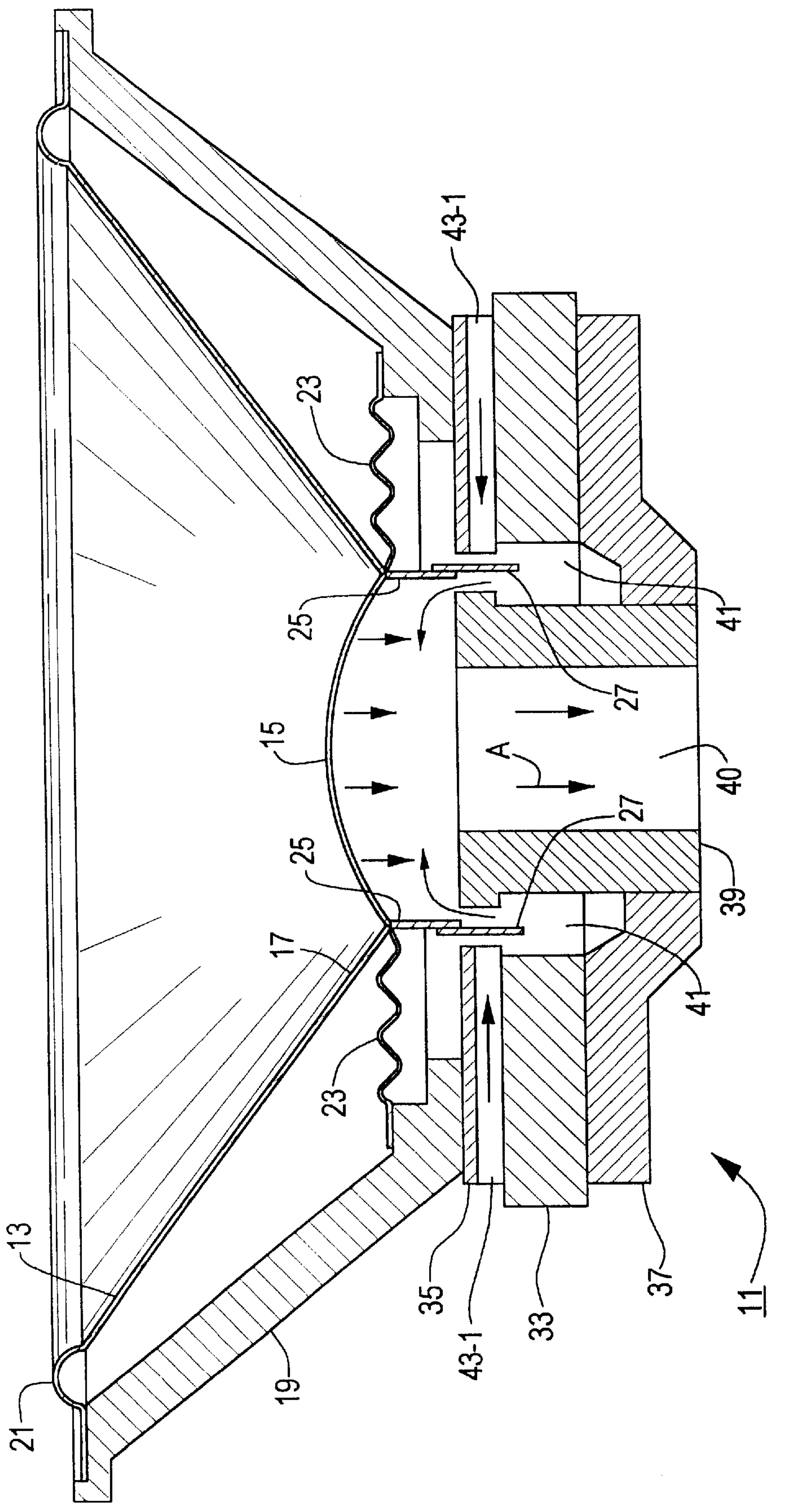
FIG. 1 is a side section view of a first embodiment of a self-cooled loudspeaker constructed according to the teachings of the present invention.
Figure 2:
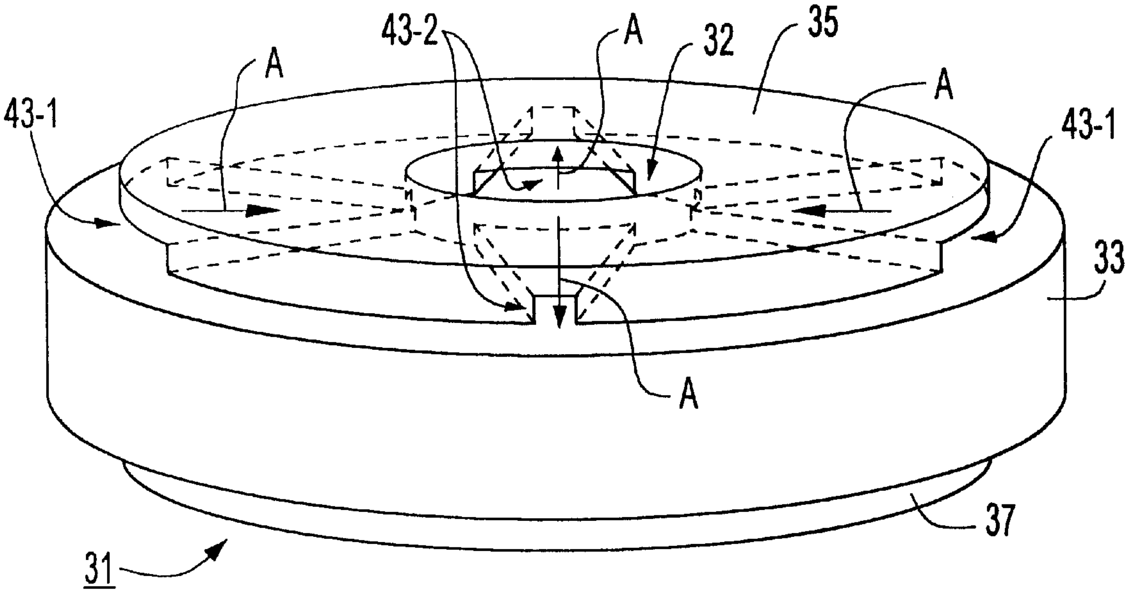
FIG. 2 is a top perspective view of the permanent magnet assembly shown in FIG. 1.

Referring now to FIGS. 1 and 2, there is shown a first embodiment of an electrodynamic, self-cooling loudspeaker constructed according to the teachings of the present invention, the loudspeaker being identified generally by reference numeral 11.

Loudspeaker 11 comprises a cone 13 which is attached by means of an adhesive to a dome 15 to form a diaphragm 17. Cone 13 and dome 15, which together form diaphragm 17, may be constructed from a stiff but well damped material such as paper or other suitable material.

Diaphragm 17 is connected to a speaker frame 19, which is constructed of a stiff antivibrational material, such as aluminum, by an upper half roll compliance 21, which may be made from a flexible and fatigue resistant material such as an urethane foam, a butyl rubber, a phenolic impregnated cloth or other similar material. Speaker frame 19 is connected to the intersection of cone 13 and dome 15 by a spider 23 which is made from a material similar in properties to the material of upper half roll compliance 21. Together upper half roll compliance 21 and spider 23 connect diaphragm 17 to speaker frame 19 in such as manner so as to limit diaphragm 17 to an axial pumping movement relative to speaker frame 19.

A former 25, which is made of a high temperature resistant plastic, is also attached diaphragm 17 at the intersection of cone 13 and dome 15. A conductive voice coil 27 is attached to former 25 such as by a conventional adhesive (not shown).

Loudspeaker 11 also comprises a permanent magnet assembly 31 which is positioned axially inward from frame support 19. Permanent magnet assembly 31 is a generally annular member having a central opening 32. Permanent magnet assembly 31 comprises a permanent magnet 33 disposed between a top plate 35 and a back plate 37, top plate 35 and back plate 37 being constructed from a material capable of carrying magnetic flux, such as steel. Top plate 35 is affixed to speaker frame 19.

A generally cylindrically-shaped pole piece 39, constructed of material capable of carrying magnetic flux, such as cast iron, is attached to back plate 37 by an adhesive or other suitable means (not shown). Pole piece 39 includes a central bore 40 and is attached to back plate 37 in such a manner so that pole piece 39 projects into central opening 32 of permanent magnet assembly 31. As shown in FIG. 1, permanent magnet assembly 31 and pole piece 39 are sized and shaped so as to create a narrow air gap 41 therebetween into which voice coil 27 is disposed.

Permanent magnet assembly 31 comprises a plurality of aerodynamically-shaped air paths 43 in communication with air gap 41 which enable for voice coil 27 to be cooled by a flow of air produced through the natural vibratory motion of the diaphragm 17 in use, as will be described further in detail below.

Specifically, top plate 35 is stamped, forged, casted or machined using well known techniques to form a plurality of aerodynamically-shaped air paths 43 between top plate 35 and permanent magnet 33. As shown in FIG. 2, plurality of aerodynamically-shaped air paths 43 include a pair of intake air paths 43-1 which decrease in cross-sectional area towards central opening 32 and a pair of outtake air paths 43-2 which increase in cross-sectional area towards central opening 32, air paths 43 being spaced equally apart from one another.

It should be noted that the present invention is not limited to the use of a permanent magnet assembly 31 which includes four air paths 43. Rather, permanent magnet assembly 31 could alternatively be constructed to include more or less air paths 43 without departing from the spirit of the present invention.

It should also be noted that the present invention is not limited to the use of a permanent magnet assembly 31 which includes an equal number of intake air paths 43-1 and outtake air paths 43-2. Rather, permanent magnet assembly 31 could alternatively be constructed to include an unequal amount of intake air paths 43-1 and outtake air paths 43-2 without departing from the spirit of the present invention. In particular, permanent magnet assembly 31 could alternatively be constructed to include only one or more intake air paths 43-1 without losing some of its utility.

It should also be noted that the present invention is not limited to the use of a permanent magnet assembly 31 which includes intake air paths 43-1 and outtake air paths 43-2 which are alternatingly disposed in an equidistant relation along the periphery of permanent magnet assembly 31. Rather, permanent magnet assembly 31 could alternatively be constructed to include intake air paths and outtake air paths which are randomly disposed in a non-equidistant relation along the periphery of permanent magnet assembly.

In use, loudspeaker 11 operates in a conventional manner. Specifically, upon application of an alternating current to conductive voice coil 27, voice coil 27 produces a magnetic field which interacts with a magnetic field produced by permanent magnet assembly 31. The interaction of the magnetic fields produced by voice coil 27 and permanent magnet assembly 31 causes voice coil 27 to oscillate linearly in accordance with the alternating current applied. The oscillation of voice coil 27, in turn, pumps diaphragm 17 linearly to produce sound. As noted previously, the electrical resistance of voice coil 27 to the application of alternating currents creates high, and potentially detrimental, levels of heat within loudspeaker 11.

Accordingly, permanent magnet assembly 31 is designed to induce a substantially unidirectional flow of air through loudspeaker 11, as represented by arrows A. Specifically, the inward pumping motion of diaphragm 17 during normal operation creates an inward flow of cool air through diaphragm 17 and intake air paths 43-1 which, in turn, enters air gap 41 and thereby lowers the temperature of voice coil 27. As can be appreciated, the inwardly decreasing cross-sectional area of intake air paths 43-1 serves to create a unidirectional flow of air into air gap 41, the aerodynamic shape of intake air paths 43-1 preventing a substantial reverse in air flow.

The outward pumping motion of diaphragm 17 during normal operation takes the warmer air trapped within air gap 41 and pushes it out through central bore 40 of pole piece 39 (as shown in FIG. 1) and outtake air paths 43-2 (as shown in FIG. 2). As can be appreciated, the inwardly increasing cross-sectional area of outtake air paths 43-2 serves to create a unidirectional flow of air away from air gap 41, the aerodynamic shape of intake air paths 43-2 preventing a substantial reverse in air flow.

It should also be noted that the particular construction of permanent magnet assembly 31 also serves to prevent stray magnetized particles from entering into air gap 41, which is an object of the present invention. Specifically, permanent magnet assembly 31 has a high magnetic flux density with lines of force which extend in a substantially perpendicular path relative to air paths 43. As a consequence, the lines of forces produced by the magnetic flux of permanent magnet assembly 31 effectively traps stray magnetized particles which pass through air paths 43 against the inner walls of air paths 43 and thereby precludes the entry of the stray magnetic particles into air gap 41, which is highly desirable.

Figure 3:
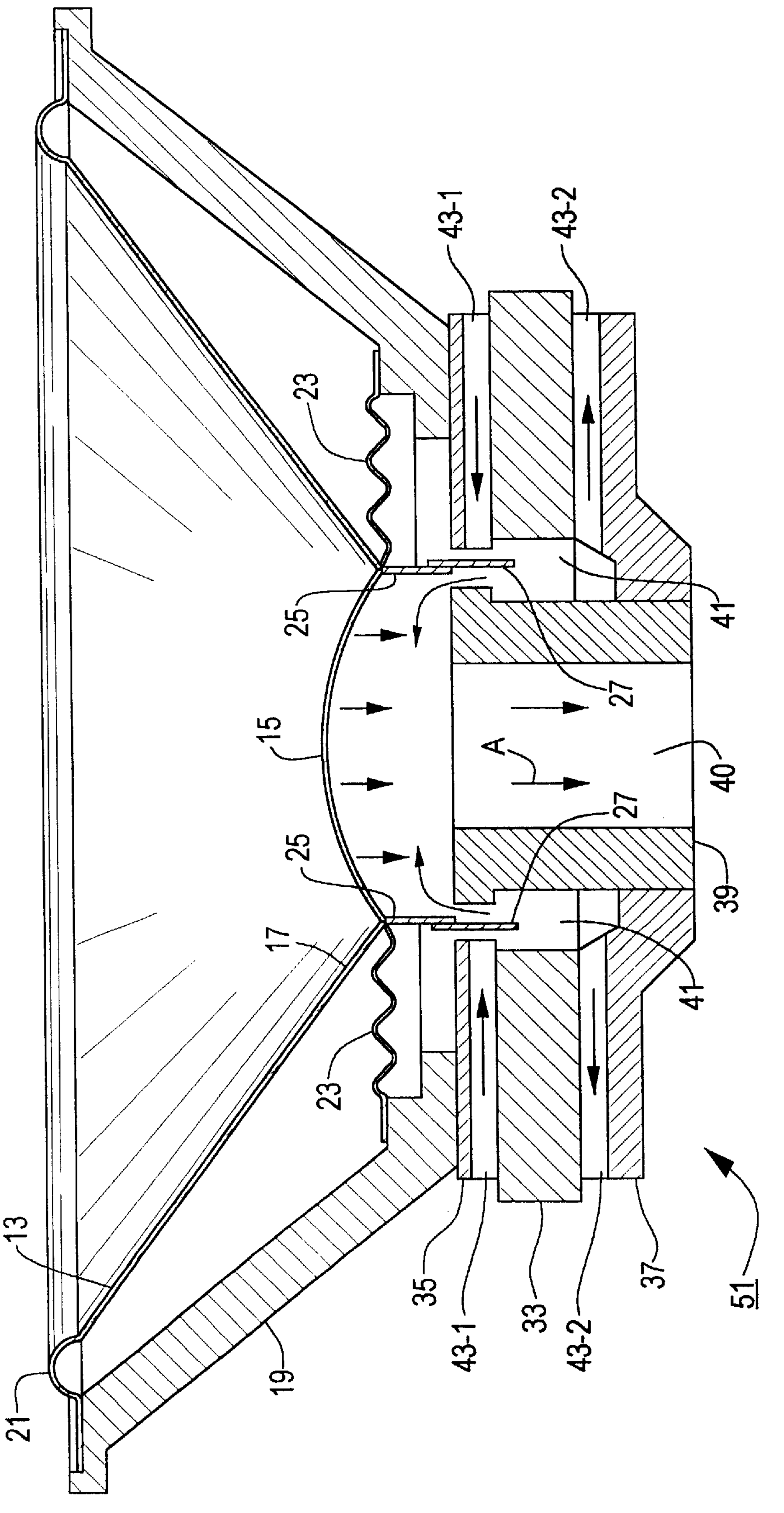
FIG. 3 is a side section view of a second embodiment of a self-cooled loudspeaker constructed according to the teachings of the present invention.
Figure 4:
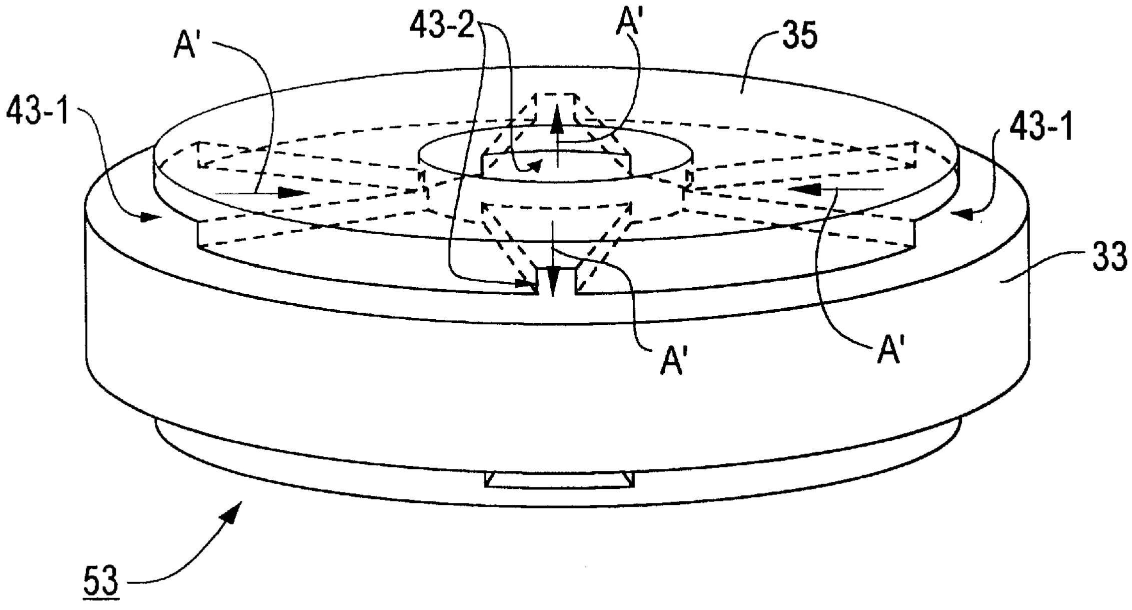
FIG. 4 is a top perspective view of the permanent magnet assembly shown in FIG. 3.
Figure 5:
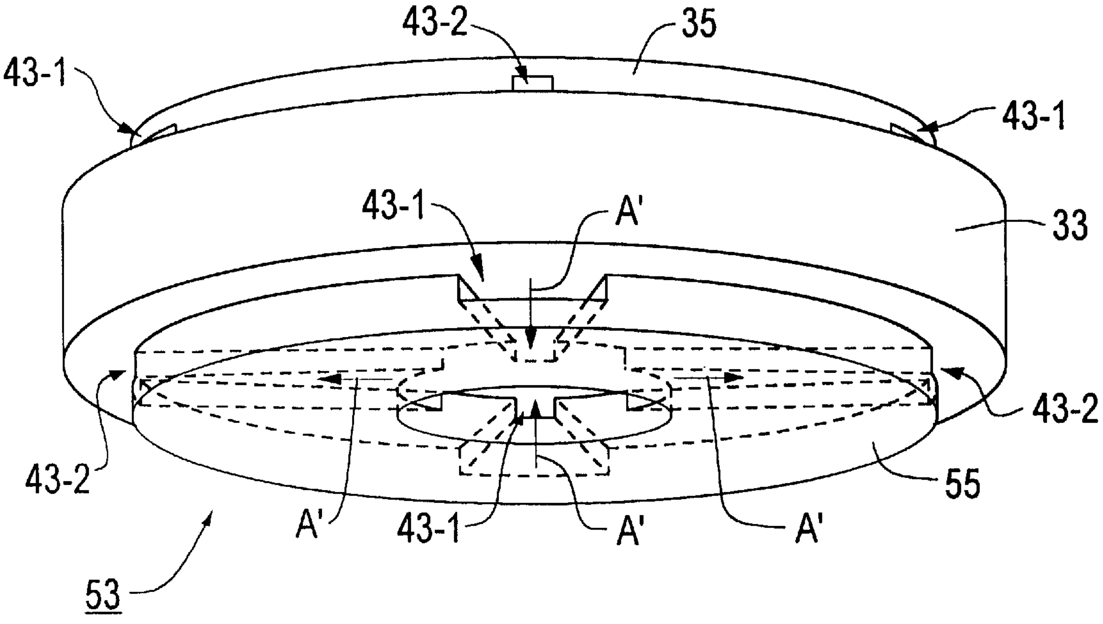
FIG. 5 is a bottom perspective view of the permanent magnet assembly shown in FIG. 4.

Referring now to FIGS. 3–5, there is shown a second embodiment of an electrodynamic, self-cooling loudspeaker constructed according to the teachings of the present invention, the loudspeaker being identified generally by reference numeral 51.

Loudspeaker 51 differs from loudspeaker 11 only in that it comprises a permanent magnet assembly 53 which differs slightly in construction to permanent magnet assembly 31. Specifically, permanent magnet assembly 53 differs from permanent magnet assembly 31 only in that permanent magnet assembly 53 comprises a back plate 55 which is shaped in a similar manner as top plate 35 so as to form an additional pair of intake air paths 43-1 and an additional pair of outtake air paths 43-2, the additional air paths 43 being formed between back plate 55 and permanent magnet 31. As can be appreciated, the implementation of additional air paths 43 between back plate 55 and permanent magnet 31 serves to improve the quality of air flow A' through loudspeaker 51.

The embodiments shown in the present invention are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A self-cooling loudspeaker comprising:

(a). a speaker frame, (b). a diaphragm connected to said speaker frame, said diaphragm being capable of linear movement, (c). a voice coil connected to said diaphragm, (d). a permanent magnet assembly having a central opening, (e). a pole piece disposed co-axially within the central opening of said permanent magnet assembly to form an air gap between said pole piece and said permanent magnetic assembly into which said voice coil is disposed, and (f). at least one intake air path formed in said permanent magnet assembly in communication with the air gap, said at least one intake air path having a decreasing cross-sectional area towards the central opening of said permanent magnet assembly, wherein linear movement of said diaphragm produces a unidirectional flow of air through said at least one intake air path.

2. The self-cooling loudspeaker assembly of claim 1 further comprising at least one outtake air path formed in said permanent magnet assembly in communication with the air gap, said at least one outtake air path having an increasing cross-sectional area towards the central opening of said permanent magnet assembly, wherein linear movement of said diaphragm produces a unidirectional flow of air through said at least one outtake air path.

3. The self-cooling loudspeaker assembly of claim 2 wherein said permanent magnet assembly comprises a permanent magnet disposed between a top plate and a bottom plate.

4. The self-cooling loudspeaker assembly of claim 3 wherein said at least one intake air path is formed between the top plate and the permanent magnet.

5. The self-cooling loudspeaker assembly of claim 4 wherein said at least one outtake air path is formed between the top plate and the permanent magnet.

6. The self-cooling loudspeaker assembly of claim 5 wherein said at least one intake air path and said at least one outtake air path are formed between the top plate and the permanent magnet by stamping the top plate.

7. The self-cooling loudspeaker assembly of claim 3 wherein said at least one intake air path is formed between the bottom plate and the permanent magnet.

8. The self-cooling loudspeaker assembly of claim 7 wherein said at least one outtake air path is formed between the bottom plate and the permanent magnet.

9. The self-cooling loudspeaker assembly of claim 8 wherein said at least one intake air path and said at least one outtake air path are formed between the bottom plate and the permanent magnet by stamping the bottom plate.

* * * * *